United States Patent [19]
Chaki

[11] 4,434,673
[45] Mar. 6, 1984

[54] CROSS ARM STRUCTURE FOR USE IN A PUSHBUTTON TUNER

[75] Inventor: Takao Chaki, Saitama, Japan

[73] Assignee: Clarion Co., Ltd., Tokyo, Japan

[21] Appl. No.: 272,618

[22] Filed: Jun. 11, 1981

[30] Foreign Application Priority Data

| Jun. 11, 1980 | [JP] | Japan | 55-80262[U] |
| Jun. 11, 1980 | [JP] | Japan | 55-70265[U] |
| Jun. 11, 1980 | [JP] | Japan | 55-80266[U] |
| Jun. 11, 1980 | [JP] | Japan | 55-80267[U] |
| Jun. 11, 1980 | [JP] | Japan | 55-80268[U] |

[51] Int. Cl.³ .......................... H03J 5/12; G05G 1/02
[52] U.S. Cl. .......................... 74/10.33; 334/7
[58] Field of Search .............. 74/10.27, 10.33; 334/7

[56] References Cited

U.S. PATENT DOCUMENTS

| 2,659,236 | 11/1953 | Allen | 74/10.33 |
| 3,680,394 | 8/1972 | Thompson | 74/10.33 |

FOREIGN PATENT DOCUMENTS

| 46-16761 | 5/1971 | Japan | 74/10.33 |
| 742939 | 1/1956 | United Kingdom | 74/10.33 |

*Primary Examiner*—Allan D. Herrmann
*Attorney, Agent, or Firm*—Flynn, Thiel, Boutell & Tanis

[57] ABSTRACT

A cross arm structure for use in a pushbutton tuner comprising a frequency setting plate pivotally supported on the cross arm and a pushing member disposed adjacent to the frequency setting plate for pressing or releasing the frequency setting plate in response to the sliding operation of the pushbutton, characterized in that the frequency setting plate is kept in a pivotal position by means of an early lock preventing plate cooperable with a top end portion of the pushing member.

8 Claims, 18 Drawing Figures

CROSS ARM STRUCTURE FOR USE IN A PUSHBUTTON TUNER

BACKGROUND OF THE INVENTION

1. Field of the Invention

This invention relates to a structure of a cross arm for use in a pushbutton tuner and more specifically to improvements in a cross arm having a relatively simple structure and capable of not only appropriately holding a frequency setting member but of also preventing it from being locked too early.

2. Description of the Prior Art

In general, a cross arm for use in a pushbutton tuner has a structure in which a frequency setting plate pivotally mounted on the cross arm is to be properly locked to carry out the tuning by pushing a pushbutton. Such frequency setting plate has to be released from its locked condition for changing its setting. However, when the frequency setting plate has been turned and is to be locked again by pushing the pushbutton from its released condition, if the frequency setting plate is locked before the pushbutton is sufficiently pushed in, a so-called "early lock" occurs. Therefore, a predetermined tuning condition previously made by a manual tuning axis is apt to be modified and thus the proper tuning relation cannot be kept.

That is, in order to lock the frequency setting plate pivotally mounted on the cross arm, there is provided a pressing member which is pushed in by slidable operation of the pushbutton. On the other hand, an early lock preventing plate is provided so that the frequency setting plate which has been released from the pressing member may not be re-locked by the pressing member until the pushbutton is sufficiently pushed in to thereby incline the frequency setting plate to a predetermined angle by means of a rotatable crank.

However, the conventional mounting structure of such frequency setting member has been one of caulkings by means of bolts and nuts or rivets, and accordingly, such early lock preventing plate other than the above caulking parts has been also fixed on the cross arm. Such conventional structure has such drawbacks that machining of parts around the frequency setting member has been made complicated and a relatively large number of parts are required, whereby it is made difficult to keep the proper operational relations between the many parts.

SUMMARY OF THE INVENTION

It is therefore an object of the present invention to eliminate the above drawbacks in the prior art. In accordance with the present invention, there is provided a cross arm structure for use in a pushbutton tuner which comprises:

a cross arm member;

a frequency setting member pivotally supported on said cross arm member;

a pushbutton means slidably supported on an end of said cross arm member;

a pressing member for applying pressure to said frequency setting member in response to sliding movement of said pushbutton means to thereby lock said frequency setting member in a predetermined position or release it from same; and an early lock preventing member cooperable with said pressing member to hold said frequency setting member in a manner preventing it from being locked too early.

BRIEF DESCRIPTION OF THE DRAWINGS

The drawings represent some embodiments according to the present invention in which:

FIG. 14 shows a partially sectioned elevational view of a further embodiment according to the invention in its unlocked condition;

FIG. 15 shows a sectioned plan view of the embodiment of FIG. 14;

FIG. 16 shows a sectioned partial plan view showing how to assemble certain components;

FIG. 17 shows a partially sectioned elevation view of the embodiment as shown in FIG. 14 in its locked condition; and FIG. 18 shows a sectioned plan view of the embodiment of FIG. 17.

DETAILED DESCRIPTION OF THE PREFERRED EMBODIMENTS

The present invention will now be described in detail referring to the preferred embodiments as shown in the accompanying drawings.

Figure 1:
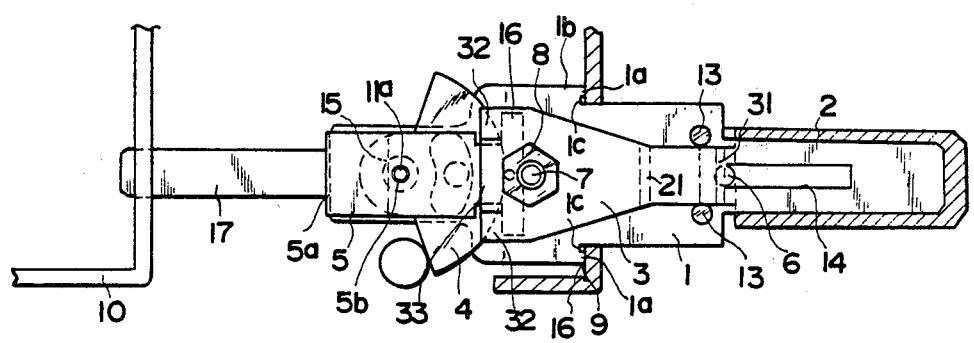
FIG. 1 shows an elevation view of a cross arm structure according to the invention.
Figure 2:
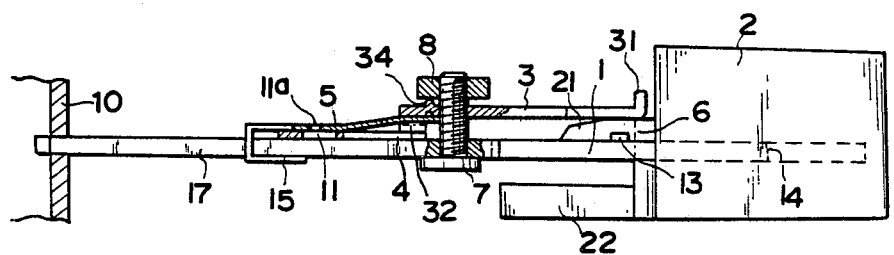
FIG. 2 shows a partially sectioned plan view of the structure as shown in FIG. 1.

In FIGS. 1–9, in a central portion of a cross arm 1 there is an opening through which is inserted a bolt or connector 7. A pushing or pressing member 3 is connected to the cross arm 1 by the connector 7 which is inserted through an opening in a top end thereof. A projection 34 formed in a central portion at the top end of the pushing member 3 is disposed against a lower surface surface of a threaded ring or nut 8 screwed on the bolt 7. A base portion of the pushing member 3 is engaged by a pushing projection 21 integrally projectedly formed on a pushbutton 2. The pushbutton 2 engages a guide bore 14 formed in a base portion of the cross arm 1 by means of a pin 6 inserted in the pushing projection 21. The base portion of the cross arm 1 is to be inserted in a receiving bore 20 of the pushbutton 2. The pushing member 3 is further formed with a pair of pedal portions 32, 32 at both sides of the top end portion and nearer to the utmost end of the pushing member 3 than the projection 34. These pedal portions 32, 32 are disposed adjacent to the outer circumference of a frequency setting plate 4 which is pivotally supported by a pin 11 which is formed with a step and is received in an opening 4a (FIG. 4) in the plate 4. The frequency setting plate 4 is pressed down by the pedal portions 32, 32 when the pushing projection is inserted between the pushing element 3 and the cross arm 1 by movement of the pushbutton 2 to a locking position, as shown in FIG. 2.

Particularly, in accordance with the invention, there is provided an early lock preventing plate 5 which has one end inserted in a concave portion 33 formed between the pedal portions 32, 32. The early lock preventing plate 5 is formed with a through bore 5b for receiving the projection 11a of the pin 11 therein and a bent portion 15 at the base portion thereof for being in contact with the lower surface of the cross arm 1. The bent portion 15 is formed with a through bore 5a through which a guide portion 17 formed at the top end of the cross arm 1 extends.

Incidentally, in FIGS. 1-9, the reference numeral 13 designates a pair of guide projections formed on the cross arm for guiding the pushing member, reference numeral 16 engaging wings opposedly formed at both sides of an end of the early lock preventing plate 5, reference numeral 31 an engaging portion formed by a bend at the base portion of the pushing member 3, reference numeral 35 a through bore through which the connector 7 extends, and reference numeral 22 a kick arm operational portion disposed in a side portion of the pin 6.

Thus, the through bore 5b in the present invention engages with the projection 11a of the pin 11 which pivotally supports the frequency setting plate 4 to thereby keep it in a predetermined proper position. Therefore, both objects of preventing too early a lock and of pivotally supporting the frequency setting plate can be realized with only one part without requiring any other parts such as bolts, nuts, rivets, etc., resulting in obtaining a simple construction of a cross arm structure as well as stable operational relations between members comprising the structure.

Figure 3:
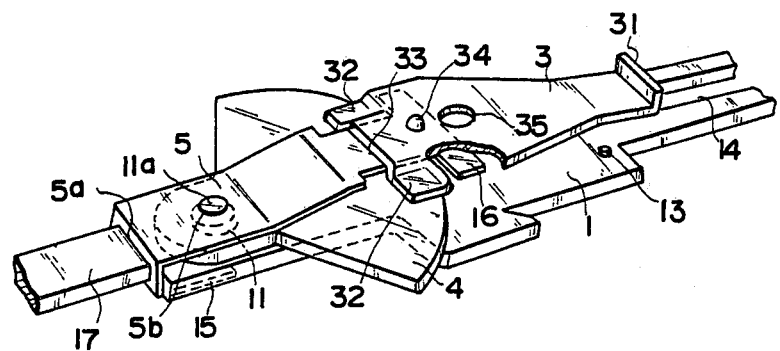
FIG. 3 shows a partially sectioned perspective view of parts about a frequency setting plate of the structure of FIG. 1.
Figure 4:
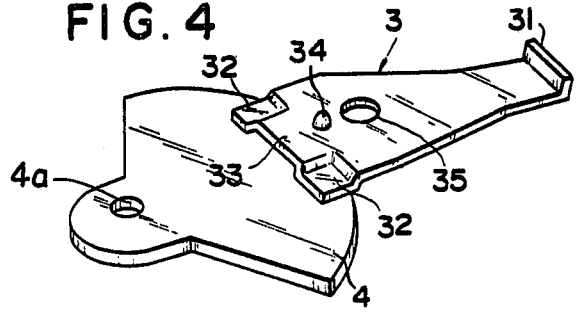
FIG. 4 shows a perspective view of the frequency setting plate and a pushing element of the structure of FIG. 1.

More specifically as shown in FIG. 3, since the early lock preventing plate 5 is inserted with its top end between the pedal portions 32, 32 of the pushing member 3, the early lock preventing plate can always be kept in a proper position relative to the pushing member 3. Further, the top end portion of the pushing member 3 is fixed on the cross arm 1 by means of the connector 7, and accordingly, its position relative to the cross arm 1 can be kept proper. Therefore, effective positional relations can be kept without providing any specific arrangement for mounting the early lock preventing plate 5 on the cross arm 1, and, a preferable function of the early lock preventing plate 5 can be obtained with a relatively simple construction.

Figure 5:
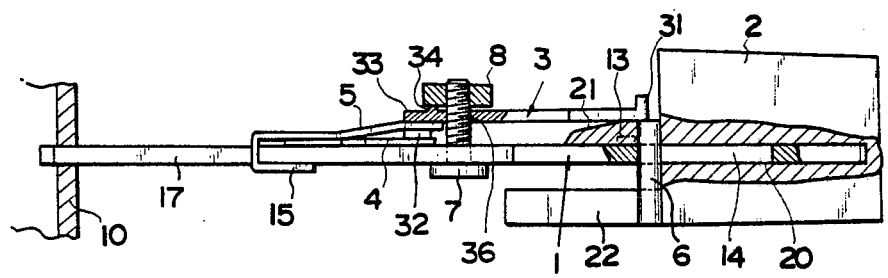
FIG. 5 shows a partially sectioned plan view of the structure of FIG. 1.
Figure 6:
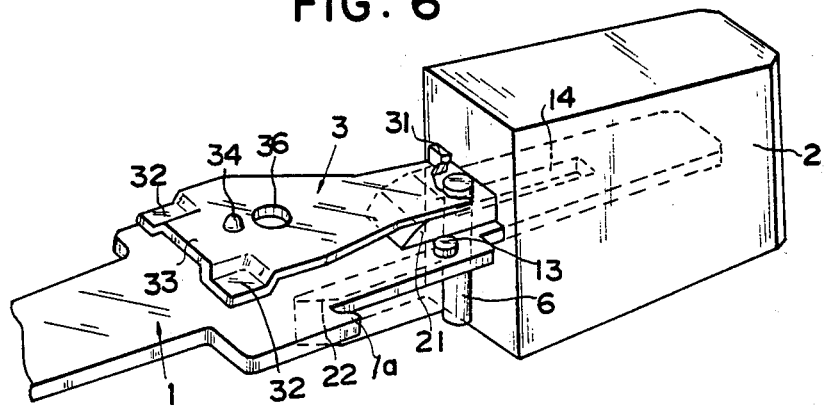
FIG. 6 shows a perspective view of the pushbutton, the base portion of the cross arm and the pushing element of the structure FIG. 1.

Further, as shown in FIGS. 5 and 6, the pushing projection 21 is integrally formed on the pushbutton 2 and the pin 6 which is inserted in the pushing projection 21 is also inserted in the guide bore 14 formed in the base portion of the cross arm 1 to be inserted in the pushbutton 2. Thus, the pushbutton 2 and the cross arm 1 are connected to each other and the slidable stroke between the pushbutton 2 and the cross arm 1 can be regulated by the pin 6. Therefore, such a resilient plate with a high resilient characteristic as conventionally required is no longer necessary in the present invention. Further, the pushbutton 2 can easily be mounted on the cross arm 1 merely by the insertion of the pin 6 without requiring formation of a slit or an opening with a complicated configuration in the pushbutton 2 nor a troublesome machining in such a narrow opening. Therefore, assembly can be attained quickly and easily with a small number of parts, thus largely reducing the labour required for producing these parts, and accordingly, enabling the mass production of these devices, resulting in the possibility of providing them at a low cost.

Figure 7:
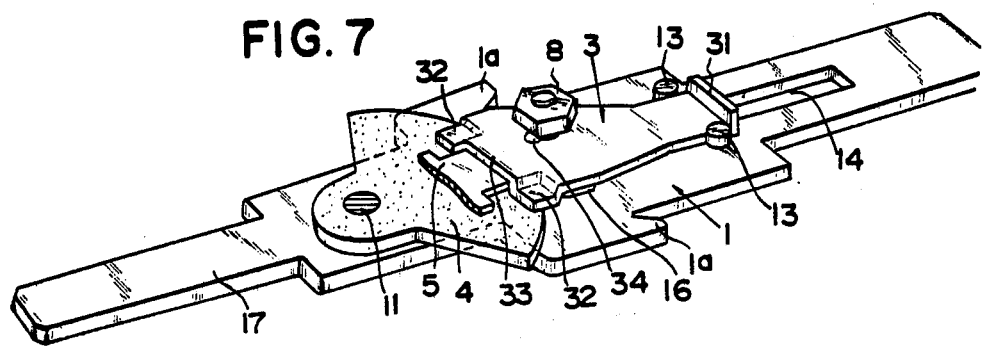
FIG. 7 shows a perspective view of the frequency setting plate, the pushing element and the cross arm of the structure of FIG. 1 in an operational position corresponding to when the pushbutton is pulled out and the pushing projection is not in use.

Further, when the pushing projection 21 is pulled out to an unlocked position, then as shown in FIG. 7, it is clear that the base portion 31 of the pushing member 3 is disposed between the guide projections 13, 13, thereby preventing the pushing member 3 from being rotated and dislocated. Additionally, when the pushbutton 3 is pushed to allow the pushing projection 21 to engage the base portion of the pushing member 3, the pushing projection 21 is guided by the guide projections so as to be pushed in an accurate direction. Thus, by the action of the pushing member 3 against the frequency setting plate 4, the frequency setting plate 4 is kept immovable, even if the pushing member 3 comes out of the guide projections 13, 13. Therefore, proper positional relations can always be kept, including the stable lock of the frequency setting plate 4. Additionally, such structure is arranged very simple by forming only the guide projections 13, 13, which does not require any specific elements or complicated machining, thus making production and assembly of the device much easier.

Figure 8:
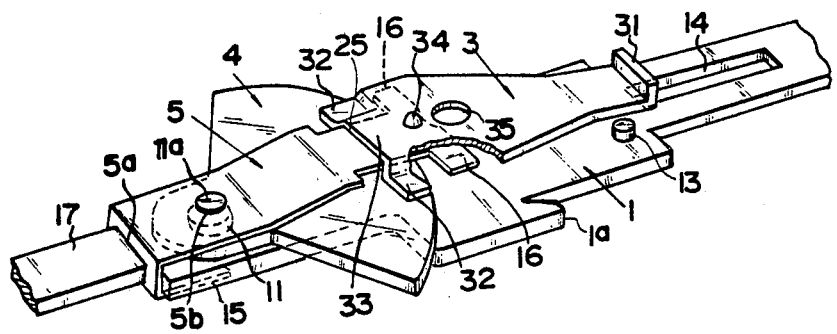
FIG. 8 shows a perspective view of part of the structure of FIG. 1 in which the pushing member is partially broken away at a location near the frequency setting plate.

Further, as shown in FIG. 8, since the early lock preventing plate 5 is arranged to press directly on the concave portion 35 of the pushing member 3, the preventing plate 5 can apparently be pressed down with accuracy. Additionally, the early lock preventing plate 5 and the pushing member 3 are always mounted in their proper positions by means of engagement between the engaging wings 16, 16 and the pedal portions 32, 32 at the top end 25 of the early lock preventing plate 5. Therefore, the pressing of the early lock preventing plate 5 is effectively transmitted to the pushing member 3 up to the time just before the preventing plate 5 is pressed down by the concave portion 33, thus to prevent it from being locked too early, whereby the objects not only of an effective lock but also of prevention of a too early lock of the frequency setting plate can be attained.

In other words, the early lock preventing plate 5 presses continuously on the concave portion 33 of the pushing member 3 to urge it away from the frequency setting plate 4 and thus, when the pushbutton 2 is in the unlocked position, keeps the pushing member 3 in a position in which the pedal portions 32 thereon are spaced from the frequency setting plate 4. As the pushbutton 2 is manually moved to its locked position, the pushing projection 21 thereon engages and pivots the pushing member 3 so that the pedal portions 32 move into engagement with the frequency setting plate 4, the concave portion 33 of pushing member 3 pressing the early lock preventing plate 5 toward the frequency setting plate 4. In this manner, the pedal portions 32 are prevented from engaging the frequency setting plate 4 except when they are moved into engagement therewith by the pushing projection 21 on the pushbutton 2.

Figure 9:
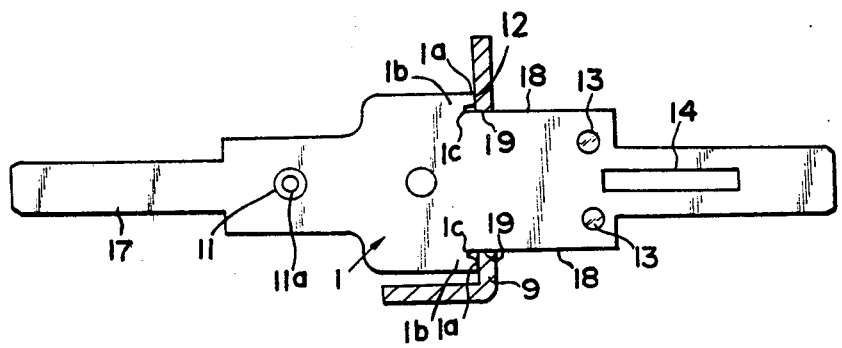
FIG. 9 shows an elevation view of the cross arm of the structure of FIG. 1.

Further, as shown in FIG. 9, there are formed notches 1c, 1c at the border between the side periphery 18 of the portion for being inserted and the enlarged step portion 1b both of the cross arm 1. That is, a rectangular corner need not be formed at the above border. Therefore, relatively rough finishing of the side periphery 18 will do for obtaining its smooth slidable movement so long as it can be inserted in the through bore 19 of front panel 9. Accordingly, the abutting edge 12 of the cross arm 1 which comes in contact with the inner surface of the front panel 9 can be finished with high accuracy thus to maintain predetermined reciprocal strokes of the cross arm 1. Thus, all pushbuttons 2 of cross arms disposed in alignment can always reciprocate in good order, whereby it is possible to provide a pushbutton tuner with a highly stable operation.

Next, another embodiment will be described hereunder.

Figure 10:
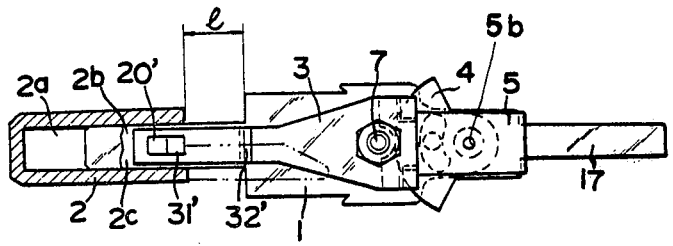
FIG. 10 shows a partially sectioned elevation view of another embodiment according to the invention in its unlocked condition.

In FIGS. 10–13, in a central portion of the pushbutton 1 there is inserted a connector 7 which is also inserted in the top end portion of the pushing member 3. The connector 7 threadedly cooperates with a threaded ring or nut 8, the lower surface of which engages a projection 3a formed in the center of the end portion of the pushing member 3. The pushing member 3 is formed with a bent step portion 32' in the central portion thereof and a through bore 31' at the base portion thereof which is to be inserted in a second receiving bore 2b of the pushbutton 2. Within the through bore 31' there is insertable a projection 20' formed on a partition wall 2c of the pushbutton 2 and projecting toward the second receiving bore 2b in a manner so that at least the stroke (l) as shown in FIG. 10 is possible. A pushing projection 21 formed in the top end portion of the partition wall 2c of the pushbutton 2 can engage the lower surface of the base portion of the pushing member 3.

Figure 11:
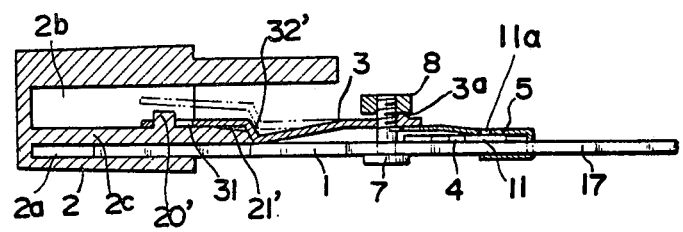
FIG. 11 shows a sectioned plan view of the embodiment of FIG. 10.
Figure 12:
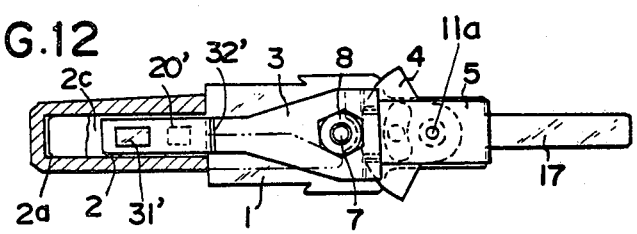
FIG. 12 shows a partially sectioned elevation view of the embodiment of FIG. 10 in its locked condition.
Figure 13:
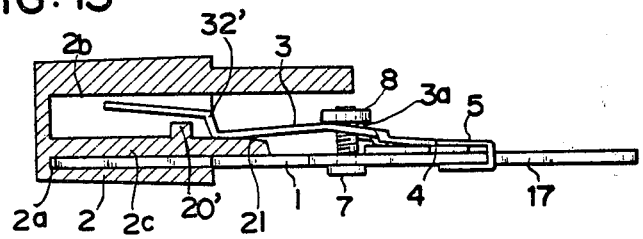
FIG. 13 shows a sectioned plan view of the embodiment of FIG. 12.

Incidentally, at both sides of the top end portion and nearer to the utmost end of the pushing member 3 than the projection 3a, there are formed a pair of pedal portions 32'. These pedal portions are disposed adjacent to the outer circumferential end of the frequency setting plate 4 which is pivotally supported by the pin 11 which is provided on the top end portion of the cross arm 1. Thereby, the frequency setting plate 4 is pressed down when the pushing projection 21 is pushed in between the pushing member 3 and the cross arm 1 by pushing the pushbutton 2, as shown in FIG. 11. Between the pedal portions there is formed a concave portion in which the top end portion of the early lock preventing plate 5 is inserted. A through bore 5b formed in the early lock preventing plate 5 receives a projection 11a of a pin 11 therein. The early lock preventing plate 5 has a bent portion at its base end which is in contact with the lower surface of the cross arm 1. The bent portion is also formed with a through bore through which the guide portion 17 of the cross arm 1 extends.

A further embodiment according to the invention is shown in FIGS. 14–18. This embodiment is the same as the embodiment shown in FIGS. 10–13 in its general construction. However, in this embodiment, the base end of the pushing member 3 is formed with an inclined guide portion 30', and, on the other hand, the projection 20' is formed with a sloping surface 20'a which is parallel with the inclination of the inclined guide portion 30' in a manner facing the opening of the bore 2b.

With this arrangement, the pushbutton 3 and the pushing member 3 are properly connected to each other in their unlocked condition by means of the through bore 31' formed in the base end portion of the pushing member 3 and the projection 20' which is formed near the pushing projection 21 which is integrally formed with the partition wall 2c of the pushbutton 2. Additionally, the pushing member 3 is properly connected to the cross arm by means of the connector 7. Therefore, the whole device can be assembled with accuracy. That is, the device can easily be assembled solely by inserting the base end portion of the pushing member 3 in the bore 2b, without using an element with high resilience which has been indispensable to the conventional art.

Thus, a preferable mounting can be done without requiring bending of specific materials at bores or openings of the pushbutton. Further, since there is no need of wedging in connecting pins, etc., the production and mounting are made much easier. Further, the number of constructing parts is reduced, whereby it is capable of providing such pushbutton structure at a lower cost.

Incidentally, according to the embodiment shown in FIGS. 14–18, the assembly operation is made further easier because the inclined guide portion 30' and the sloping surface 20'a cause smooth engagement between the projection 20' and the through bore 31'.

The embodiments of the invention in which an exclusive property or privilege is claimed are defined as follows:

1. A cross arm structure for use in a pushbutton tuner, comprising:
   a cross arm member;
   a frequency setting member pivotally supported on said cross arm member;
   a pushbutton slidably supported on said cross arm member for movement between locked and unlocked positions;
   a movably supported pressing member responsive to movement of said pushbutton and adapted to apply pressure to said frequency setting member in response to movement of said pushbutton to said locked position so as to releasably lock said frequency setting member in a predetermined angular position; and
   early lock preventing means which includes an early lock preventing member cooperable with said pressing member for preventing said pressing member from releasably locking said frequency setting member before said pushbutton is substantially in said locked position;
   wherein said pressing member has a pedal portion at each side of an end thereof which can engage said frequency setting member and has a concave portion between said pedal portions which receives an end portion of said early lock preventing member.

2. The structure as claimed in claim 1, wherein said cross arm member has a guide slot with which said pushbutton cooperates.

3. The structure as claimed in claim 1, wherein said pushbutton has a pushing projection integrally formed therewith and cooperable with said pressing member so as to press said pressing member against said frequency setting member when said pushbutton is in said locked position.

4. The structure as claimed in claim 1, wherein said cross arm member has a plurality of guide projections thereon which guide an end portion of said pressing member.

5. The structure as claimed in claim 1, further comprising connector means for movably supporting said pressing member at said end thereof on said cross arm member.

6. A cross arm structure for use in a pushbutton tuner, comprising:
   a cross arm member;
   a frequency setting member pivotally supported on said cross arm member;
   a pushbutton slidably supported on said cross arm member for movement between locked and unlocked positions;
   a movably supported pressing member responsive to movement of said pushbutton and adapted to apply pressure to said frequency setting member in response to movement of said pushbutton to said locked position so as to releasably lock said frequency setting member in a predetermined angular position; and
   early lock preventing means cooperable with said pressing member for preventing said pressing member from releasably locking said frequency setting member before said pushbutton is substantially in said locked position;
   wherein said pushbutton has a receiving bore which slidably receives a base portion of said pressing member, and wherein said base portion of said pressing member is formed with an engaging bore cooperable with a projection formed within said receiving bore.

7. The structure as claimed in claim 6, wherein said pressing member is formed with an inclined guide portion on said base portion thereof and said pushbutton has a sloping surface at an end of said projection in said receiving bore.

8. The structure as claimed in claim 6, wherein said cross arm member has a plurality of guide projections thereon which guide an end portion of said pressing member.

* * * * *